US007600168B2

(12) United States Patent  
Chen et al.

(10) Patent No.: US 7,600,168 B2
(45) Date of Patent: Oct. 6, 2009

(54) APPARATUS WITH PROGRAMMABLE SCAN CHAINS FOR MULTIPLE CHIP MODULES AND METHOD FOR PROGRAMMING THE SAME

(75) Inventors: Po-Yuan Chen, Sinjhuang (TW); Cheng-Sheng Chan, Hsinchu (TW); Hui-Ming Lin, Hsinchu (TW)

(73) Assignee: Prolific Technology Inc., Taipei (TW)

( * ) Notice: Subject to any disclaimer, the term of this patent is extended or adjusted under 35 U.S.C. 154(b) by 267 days.

(21) Appl. No.: 11/640,863

(22) Filed: Dec. 19, 2006

(65) Prior Publication Data

US 2007/0150781 A1 Jun. 28, 2007

(30) Foreign Application Priority Data

Dec. 26, 2005 (TW) .............................. 94146440 A

(51) Int. Cl.
*G01R 31/28* (2006.01)
(52) U.S. Cl. ........................ 714/729; 714/727
(58) Field of Classification Search ................. 714/726, 714/729, 727, 741
See application file for complete search history.

(56) References Cited

U.S. PATENT DOCUMENTS

| | | | | |
|---|---|---|---|---|
| 4,872,169 A | * | 10/1989 | Whetsel, Jr. ................. | 714/727 |
| 5,321,277 A | * | 6/1994 | Sparks et al. .................. | 257/48 |
| 5,347,519 A | * | 9/1994 | Cooke et al. ................. | 714/725 |
| 5,592,493 A | * | 1/1997 | Crouch et al. ................ | 714/729 |
| 5,726,999 A | * | 3/1998 | Bradford et al. ............. | 714/727 |
| 5,774,475 A | * | 6/1998 | Qureshi ........................ | 714/726 |
| 5,867,507 A | * | 2/1999 | Beebe et al. ................. | 714/726 |
| 6,021,513 A | * | 2/2000 | Beebe et al. ................. | 714/726 |
| 6,848,067 B2 | | 1/2005 | Perner | |
| 7,134,061 B2 | * | 11/2006 | Agashe et al. ............... | 714/726 |
| 2002/0177990 A1 | * | 11/2002 | Sample ........................ | 703/28 |
| 2005/0278588 A1 | * | 12/2005 | Cohn et al. ................... | 714/51 |
| 2006/0284174 A1 | * | 12/2006 | Keller et al. .................. | 257/48 |
| 2008/0295045 A1 | * | 11/2008 | Aktouf .......................... | 716/4 |

OTHER PUBLICATIONS

"Testchip: a chip for weighted random pattern generation,evaluation, and test control" by Strole et al. Solid-State Circuits, IEEE Journal of Publication Date: Jul. 1991 vol. 26, Issue: 7 On pp. 1056-1063 ISSN: 0018-9200 INSPEC Accession No. 4016579.*

"Reducing test power during test using programmable scan chain disable" by Sankaralingam et al.Electronic Design, Test and Applications, 2002. Proceedings. The First IEEE International Workshop on Publication Date: 2002 On pp. 159-163 ISBN: 0-7695-1453-7 INSPEC Accession No. 7327792.*

* cited by examiner

*Primary Examiner*—Cynthia Britt
(74) *Attorney, Agent, or Firm*—WPAT, P.C.; Justin I. King

(57) ABSTRACT

An apparatus provided with programmable scan chains includes a scan chain having a scan input port and a scan output port, a plurality of first I/O ports, an input port selector for selecting one of the plurality of first I/O ports to be coupled to the scan input port, a plurality of second I/O ports, an output port selector for selecting one of the plurality of second I/O ports to be coupled to said scan output port. Further, an apparatus provided with programmable scan chains includes N scan chains, each scan chain having a scan input port and scan output port, M first I/O ports, an input port selector for selecting N of the first I/O ports to be coupled to the N scan input ports, K second I/O ports, and an output port selector for selecting N of the second I/O ports to be coupled to the N scan output ports.

10 Claims, 6 Drawing Sheets

US 7,600,168 B2

APPARATUS WITH PROGRAMMABLE SCAN CHAINS FOR MULTIPLE CHIP MODULES AND METHOD FOR PROGRAMMING THE SAME

BACKGROUND OF THE INVENTION

1. Field of the Invention

The present invention relates to technology about programmable scan chains in integrated circuit design. More particularly, the invention relates to an apparatus with programmable scan chains for multiple chip modules and method for programming the same.

2. Description of Related Art

In designs of application-specific integrated circuits, particularly the designs of circuits with gate-counts up to several millions, a chip is commonly integrated with a design for test (DFT) function to increase production's test efficiency. FIG. 1 illustrates a block diagram of a chip with DFT function. In FIG. 1, the chip 100 includes scan chains 102A, 102B ... 102N, scan input ports 104A, 104B ... 104N, and scan output ports 106A, 106B ... 106N. As shown in the FIG. 1, test patterns are input from the scan input ports 104A, 104B ... 104N, to the scan chains 102A, 102B ... 102N, then test results are sent to and output from scan output ports 106A, 106B ... 106N. The function status of the chip 100 is reported by the test patterns output from the 106A, 106B ... 106N.

However, in order to reduce the I/O ports for lowering the chip package cost, prior art such as U.S. Pat. No. 6,848,067 provides an apparatus having multi-port scan chain selector, where I/O ports are shared in a circuit. The prior art according to the U.S. Pat. No. 6,848,067 is shown in the FIG. 2. In FIG. 2, a chip 200 includes scan chains 202A, 202B ... 202N, a scan input port 204 and a scan output port 206. According to U.S. Pat. No. 6,848,067, the apparatus reduces the scan I/O ports required by the DFT function. The multiple scan chains 202A, 202B ... and 202N share a single scan input port 204 via a scan selector 208 and a single output port 206 via a scan selector 210.

As system-on-chip has become common in integrated circuit design, the DFT function becomes popular in mass production of chips. When a chip delivers more functions, the chip requires more transistors, which means the I/O ports count also increases as a result. The I/O ports required by the DFT function do not account for major part of total I/O ports required by a chip. Thus, the apparatus according to U.S. Pat. No. 6,848,067 does not reduce package cost by providing the circuit sharing I/O ports. On the contrary, the apparatus increases the time to test a chip and results in higher test cost.

In addition, due to inherent restrictions of manufacturing process of digital and analog circuits or concerns to improve chip yield, multi-chip module technology is utilized to integrate several small-size chips in one module. However, the wiring bonding out from the scan I/O ports of the chips integrated in the multi-chip module may be interfered by the physical interconnection of the chips. Therefore, the scan chains of the chips can not be used for chip function tests and lead to incomplete coverage of chip function tests. Such problem has been addressed by providing additional function tests to improve overall test coverage. However, additional tests directly increase the test cost but has not yet delivered test coverage as expected.

SUMMARY OF THE INVENTION

Therefore, an object of the invention is to provide an apparatus with programmable scan chains for multiple chip module and a method for programming the same to overcome the problem encountered in the prior art.

To obtain the above object, an apparatus is provided with programmable scan chains in the present invention. The apparatus includes a scan chain having a scan input port and a scan output port, a plurality of first I/O ports, an input port selector for selecting one of the plurality of first I/O ports to be coupled to the scan input port, a plurality of second I/O ports, and an output port selector for selecting one of the plurality of second I/O ports to be coupled to the scan output port.

Further, the present invention further provides an apparatus provided with programmable scan chains includes N scan chains, each scan chain having a scan input port and a scan output port, M first I/O ports, an input port selector for selecting N of the first I/O ports to be coupled to the N scan output ports respectively, K second I/O ports, and an output port selector for selecting N of the second I/O ports to be coupled to the N scan output ports respectively.

DETAILED DESCRIPTION OF THE PREFERRED EMBODIMENT

Figure 1:
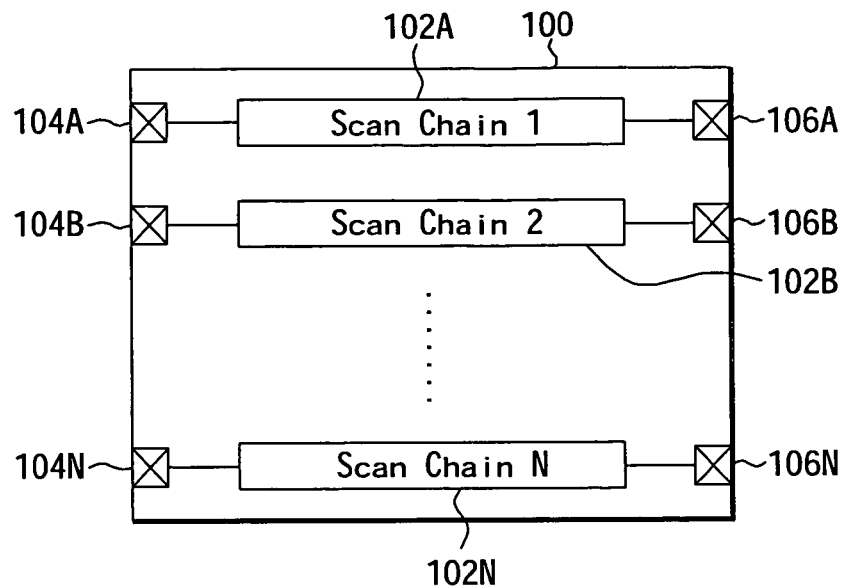
FIG. 1 illustrates a block diagram of a chip having DFT function according to the prior art.
Figure 2:
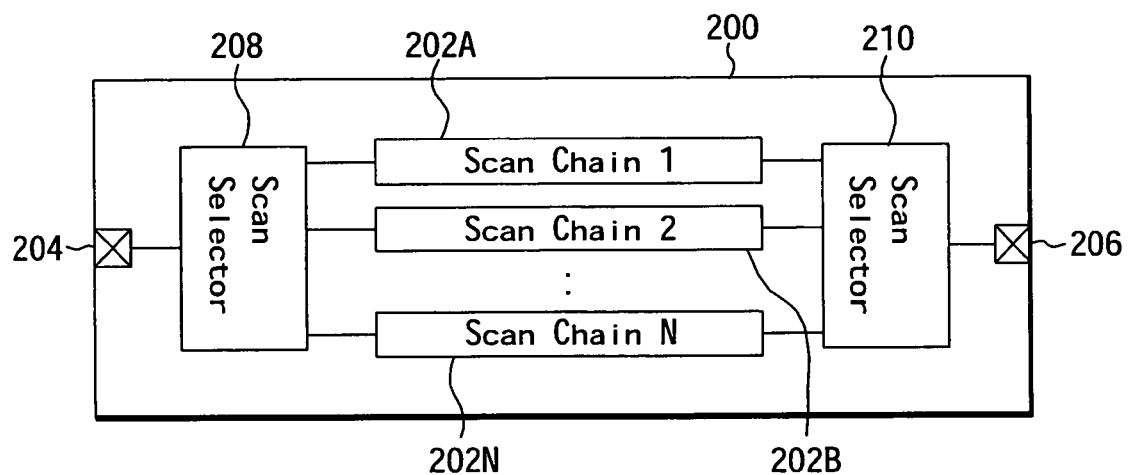
FIG. 2 illustrates a block diagram of a chip having sharing I/O ports according to the prior art.
Figure 3:
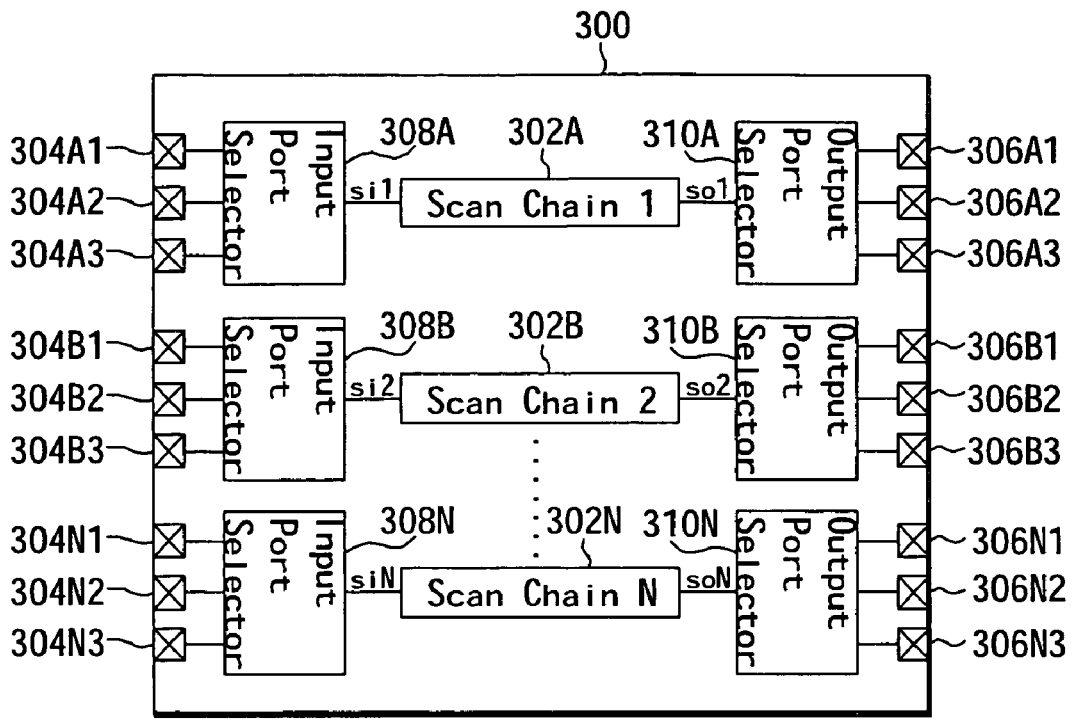
FIG. 3 illustrates a block diagram of one preferred embodiment of an apparatus having programmable scan chains according to the present invention.

FIG. 3 illustrates a block diagram of one preferred embodiment of an apparatus having programmable scan chains according to the present invention. In the FIG. 3, a chip 300 includes scan chains 302A, 302B ... 302N, scan input ports 304A1, 304A2, 304A3 corresponding to the scan chain 302A, scan input ports 304B1, 304B2, 304B3 corresponding to the scan chain 302B, and scan input ports 304N1, 304N2, 304N3 corresponding to the scan chain 302N. In addition, the chip 300 further includes scan output ports 306A1, 306A2, 306A3 corresponding to the scan chain 302A, scan output ports 306B1, 306B2, 306B3 corresponding to the scan chain 302B, and scan output ports 306N1, 306N2, 306N3 corresponding to the scan chain 302N. Specifically, in the embodiment, the apparatus applies three scan input ports corresponding to a scan chain and three scan output ports corresponding to a scan chain. The embodiment is one of the embodiments according to the present invention. The scope of the present invention is not limited to the above implementation of the embodiment.

As shown in the FIG. 3, an input port selector 308A selects one of the scan input ports 304A1, 304A2 and 304A3. The scan input port selected is coupled to the scan chain 302A via a signal wire si1. The scan chain 302A is then coupled to the one of the output ports 306A1, 306A2 and 306A3 selected by an output port selector 310A via a signal wire so1. Further, an input port selector 308B selects one of the scan input ports 304B1, 304B2 and 304B3. The scan input port selected is coupled to the scan chain 302B via a signal wire si2. The scan chain 302B is then coupled to the one of the output ports 306B1, 306B2 and 306B3 selected by an output port selector 310B via a signal wire so2. Similarly, an input port selector 308N selects one of the scan input ports 304N1, 304N2 and 304N3. The scan input port selected is coupled to the scan chain 302N via a signal wire siN. The scan chain 302N is then coupled to the one of the output ports 306N1, 306N2 and 306N3 selected by an output port selector 310N via a signal wire soN.

According to the preferred embodiment shown in FIG. 3, when certain scan input ports and scan output ports are applied as interconnection pin interface and the pins can't be used to form bonding out wires, the input port selector or output port selector can adjust the input port and output port in flexible manner to the port available for forming bonding out wire. As a result, the DFT function can perform on the chip 300 so as to increase the test coverage of the manufacturing process.

Figure 4:
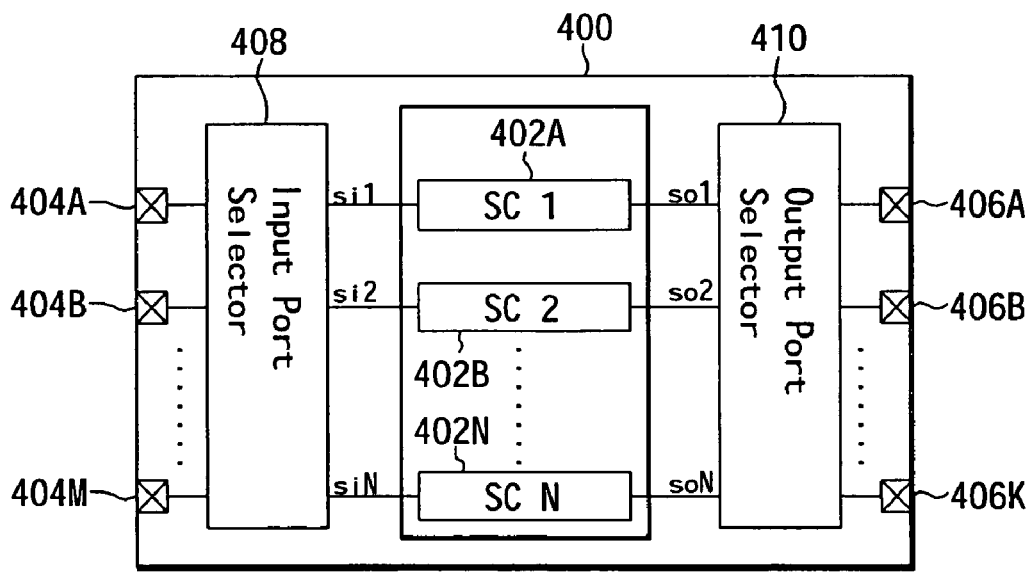
FIG. 4 illustrates a block diagram of another preferred embodiment of an apparatus having programmable scan chains according to the present invention.

FIG. 4 illustrates a block diagram of another preferred embodiment of an apparatus having programmable scan chains according to the present invention. In FIG. 4, the chip 400 includes scan chains 402A, 402B . . . 402N, scan input ports 404A, 404B . . . 404M, and scan output ports 406A, 406B . . . 406K. M, N, and K are positive integers of the same or different values. In addition, an input port selector 408 is coupled to the scan chain 402A, 402B . . . 402N via signal wires si1, si2 . . . siN, and an output port selector is coupled to the scan chain 402A, 402B . . . 402N via signal wires so1, so2 . . . soN. One of the scan input ports 404A, 404B . . . 404M is selected by the input port selector 408 and coupled to the one of the signal wires si1, si2 . . . siN. One of the scan output ports 406A, 406B . . . 406N is selected by the output port selector 410 and coupled to the one of the signal wires so1, so2 . . . soN.

According to the preferred embodiment shown in FIG. 4, when certain scan input ports and scan output ports are applied as interconnection pins and the pins can't be used to form bonding out wires, the input port selector or output port selector can adjust the input port and output port in flexible manner to the port available for forming bonding out wire. As a result, the DFT function is allowed to perform on the chip 400 so as to increase the test coverage of the manufacturing process.

Figure 5:
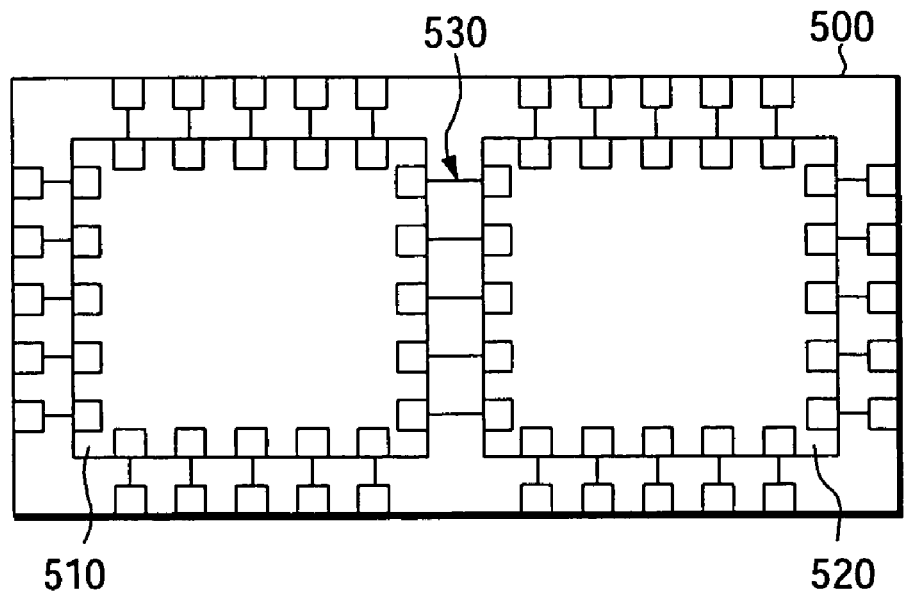
FIG. 5 illustrates a schematic diagram of two chips interconnected in a multiple chip module.
Figure 6:
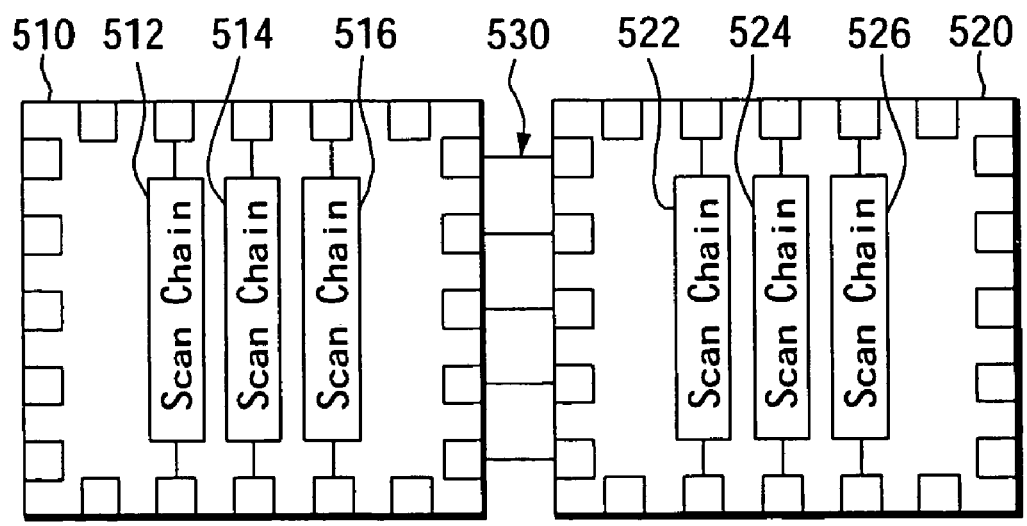
FIG. 6 illustrates a schematic diagram of two chips interconnected with a type I configuration in a multiple chip module.
Figure 7:
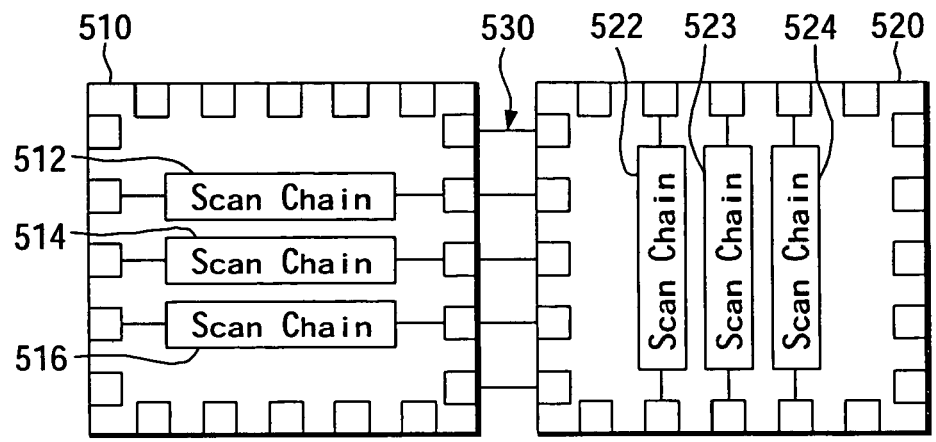
FIG. 7 illustrates a schematic diagram of two chips interconnected with a type II configuration in a multiple chip module.
Figure 8:
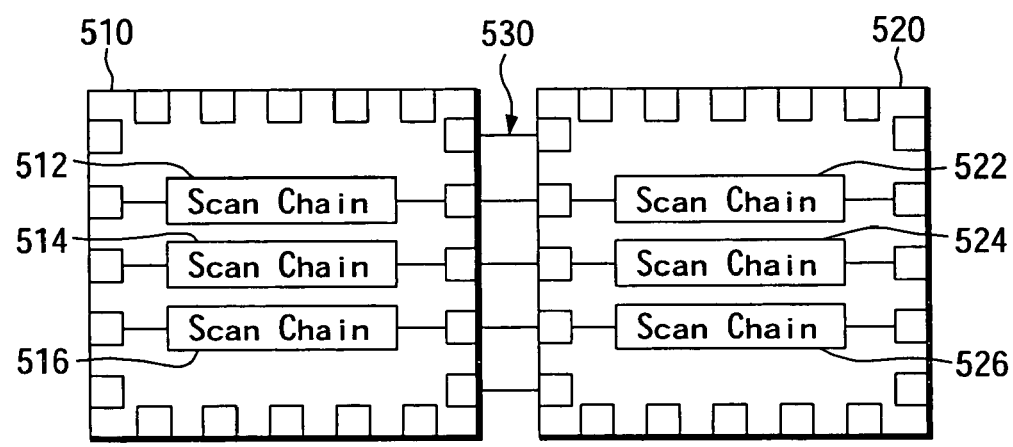
FIG. 8 illustrates a schematic diagram of two chips interconnected with a type III configuration in a multiple chip module.

FIG. 5 illustrates a schematic diagram of two chips interconnected in a multiple chip module. In the multiple chip module 500, there are output ports and input ports interconnected between chips 510 and 520. The interconnected ports do not required bonding out wiring. As a result, the manufacturing cost is reduced by having less pin out on a chip. The chip 510 has scan chains 512, 514, 516. The chip 520 has scan chain 522, 524, 526. The chip 510 and the chip 520 are integrated into the multiple chip module 500. The corresponding relationship among scan chains of the chip 510 and the chip 520 are categorized into three types: (1) Type I: as shown in the FIG. 6, where neither the chips 510 or the chip 520 have scan I/O ports located at the interconnection ports 530 (2) Type II: as shown in FIG. 7, where only one chip (for example: the chip 510) has the scan input port or the scan output port located at the interconnection ports 530, and (3) Type III: as shown in FIG. 8, where the chips 510, 520 both have the scan I/O ports located at the interconnection ports 530.

When the corresponding type is Type I, since there is no scan input ports or scan output ports located at the interconnection port 530. Therefore, the DFT function is allowed to perform without having programmable scan I/O ports for changing the location of the scan I/O ports. When the corresponding type is Type II and Type III, the chip 510, 520 have part of the scan I/O ports located at the interconnection ports 530, where the bonding out wiring is impossible. Therefore, the DFT function can't perform on multiple chip modules with scan chains having Type II or Type III corresponding relationship.

As shown in FIG. 3 and FIG. 4, the apparatus having programmable scan chains according to the present invention is provided to overcome the problem occurred when the multiple chip module is of Type II or Type III corresponding relationship.

In the FIG. 3, a scan chain corresponds to multiple scan input ports and multiple scan output ports, for example, the scan chain 302A corresponds to multiple scan input ports 304A1, 304A2, 304A3 and multiple scan output ports 306A1, 306A2, 306A3. The scan input port selector 308A is used to select one input port out of multiple scan input ports 304A1, 304A2, 304A3. The scan output port selector 310A is used to select one output port out of multiple scan output ports 306A1, 306A2, 306A3. The selection of the scan input ports and the scan output ports can be decided by power strapping under power-on-reset procedure or any other mode selection method such as fuse or laser cut in chip's initialization.

Figure 9:
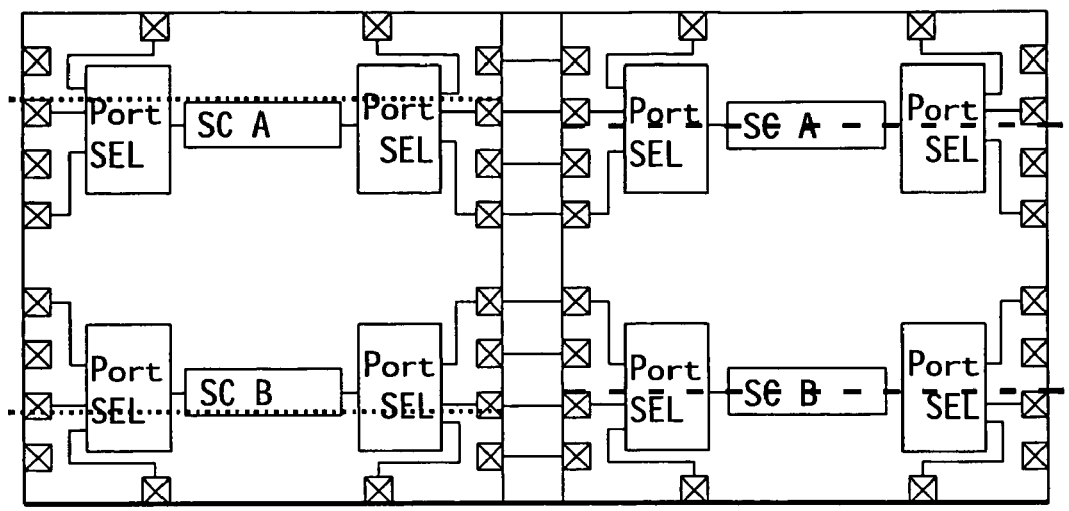
FIG. 9 is a schematic diagram of a preferred embodiment of the apparatus according to the present invention.
Figure 9:
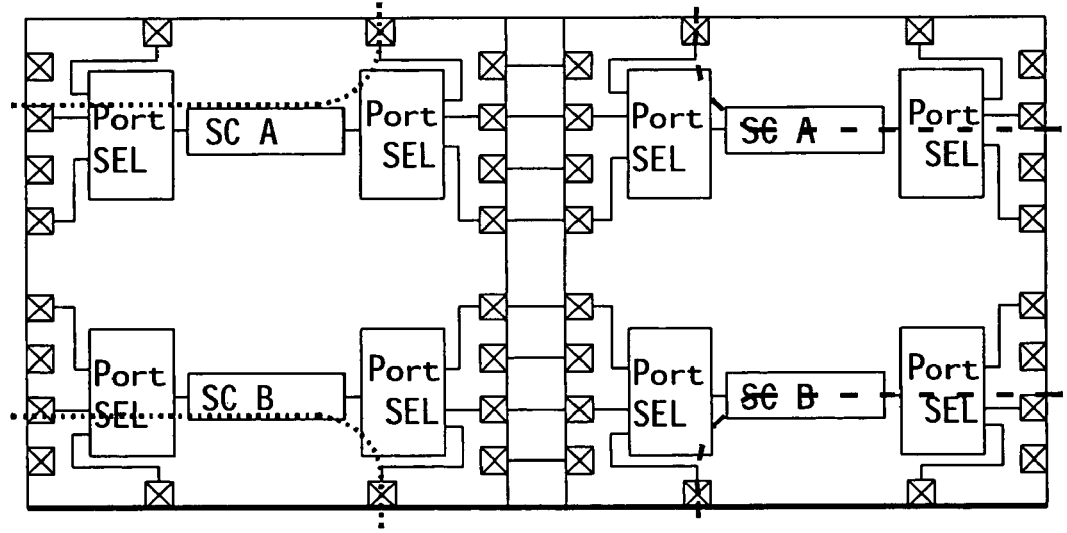

In FIG. 4, the input selector 408 selects N scan input ports si1, si2 . . . siN out of M scan chain input ports 404A, 404B . . . 404M as the scan chain input interface. The output selector 410 selects N scan chain output ports so1, so2 . . . soN act as scan chain output interface to become K output ports 406A, 406B . . . 406K. The selection can be implemented by means of using values stored in non-volatile memory such as PROM, EEPROM or flash memory, or by means of laser cutting method in chip test stage. If the values of M, N and K are small enough, the result value can be set as the pull-up/down value when the non-DFT ports are at reset state. If the chip is individual, the selection of input ports or output ports can be executed under the DFT procedure. However, when chips are interconnected, certain scan input ports or scan output ports can't form bonding out wiring. Therefore, the apparatus according to the present invention provides the function selecting other ports to become scan input ports or scan output ports. FIG. 9 is schematic diagram of an embodiment transforming interconnected chips having Type III scan chain circuitry into interconnected chips having Type I scan chain circuitry via the apparatus according to the present invention so as to perform DFT function.

Figure 10:
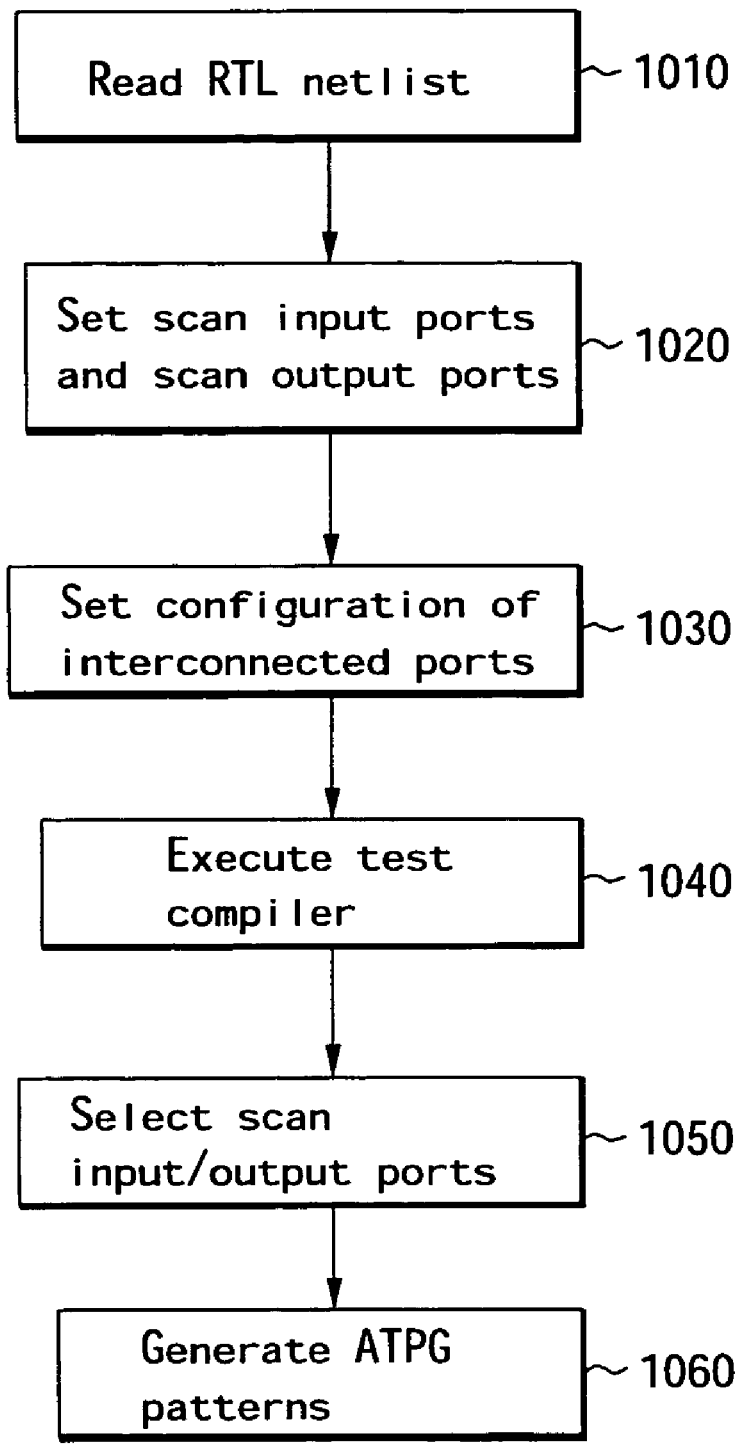
FIG. 10 is a process flow chart illustrating a method for programming the DFT function according to the present invention.

In order to launch the DFT function on multiple chips interconnected, in addition to transforming the corresponding relationship of the scan chains to Type I configuration, the interconnected pins on the multiple chips are required to have specific setup in the program flow of the DFT function. Under the condition where the interconnected pins only serve as input ports or output ports, the specific setup in the program flow of the DFT function is not required. However, the interconnected pins in a multiple chip module serve as bidirectional pins, where the signal state used is tri-state. As a result, the pins using tri-state signaling require specific set up in the program flow of the DFT function. FIG. 10 is a process flow chart illustrating a method for programming the DFT function according to the present invention. Firstly, the step 1010 explains that the RTL (Register Transfer Layer) netlist data is read. The step 1020 is setting scan input ports and a scan output ports. The step 1010 and the step 1020 are the same with steps implemented in the prior art. After the scan input ports and the scan output ports are set, the step 1030 is to set the configurations of the interconnected ports of the chips. For an individual chip, the bidirectional pin configuration is allowed to set as either the input interface or the output interface. When multiple chips are integrated in a multiple chip module, the state of the tri-state signals of the bidirectional pins requires specific setup, such that the bidirectional pins are allowed to function without conflicts according to the test algorithm. One interconnected pin in the multi chip module should serve as a driver (i.e. output interface) at one end and as a receiver (i.e. input interface) at another end. For example, when a interconnected port at a chip A is set as the output interface, then the interconnected port at a chip B interconnected with the chip A should be set as the output interface. When there are more than two chips integrated in a multiple chip module, the interconnected port of the rest of the chips should be all set as the input interface.

The step 1040 explains the test compiler is launched upon the scan input ports, the scan output ports and the interconnected ports are set. The step 1050 explains that the programmable input/output ports of the multiple chip module are provided by selecting the scan input ports and the scan output ports required for each scan chains. The port selection is completed by setting a pull-up or pull-down value of the pin reset state during power-on-reset procedure. The step 1060 explains that ATPG (Automatic Test Pattern Generation) patterns are generated and fed to the test machine used in the mass production. The method above according to the present invention does not have negative impact on the test coverage.

When the chips having programmable scan input/output ports according to the present invention are integrated with more chips to form a new system or the other multiple chip module, it is required to re-select the scan input/output ports and generate new ATPG patterns for performing DFT function.

What is claimed is:

1. An apparatus integrated onto one chip having an interconnection port to be connected with another chip, the apparatus comprising:

a programmable scan chain having a scan input port and a scan output port;

a plurality of first I/O ports;

an input port selector for selecting one of the plurality of first I/O ports to be coupled to the scan input port;

a plurality of second I/O ports; and an output port selector for selecting one of the plurality of second I/O ports to be coupled to the scan output port;

wherein the selected first I/O port and selected second I/O port are the one other than the interconnection port.

2. The apparatus as claimed in claim 1, wherein the input port selector comprises power strapping means.

3. The apparatus as claimed in claim 1, wherein the input port selector comprises mode selection means.

4. The apparatus as claimed in claim 1, wherein the output port selector comprises power strapping means.

5. The apparatus as claimed in claim 1, wherein the output port selector comprises mode selection means.

6. An apparatus integrated onto one chip having an interconnection port to be connected with another chip, the apparatus comprising:

N scan chains, each scan chain having a scan input port and a scan output port;

M first I/O ports;

an output port selector for selecting N of the M first I/O ports to be coupled to the N scan input ports respectively;

K second I/O ports; and an output port selector for selecting N of the K second I/O ports to be coupled to the N scan output ports respectively;

wherein the selected first I/O ports and the selected second I/O port are the ones other than the interconnection port;

wherein N, M and K are all positive integers.

7. The apparatus as claimed in claim 6, wherein the input port selector comprises a non-volatile memory.

8. The apparatus as claimed in claim 6, wherein the input port selector comprises laser cutting means.

9. The apparatus as claimed in claim 6, wherein the output port selector comprises a non-volatile memory.

10. The apparatus as claimed in claim 6, wherein the output port selector comprises laser cutting means.

* * * * *